United States Patent

Sperling et al.

[11] Patent Number: 6,054,784
[45] Date of Patent: Apr. 25, 2000

[54] POSITIONING DEVICE HAVING THREE COIL SYSTEMS MUTUALLY ENCLOSING ANGLES OF 120° AND LITHOGRAPHIC DEVICE COMPRISING SUCH A POSITIONING DEVICE

[75] Inventors: Frank B. Sperling, Eindhoven; Erik R. Loopstra, Heeze; Antonius T. A. Peijnenburg, Eindhoven, all of Netherlands

[73] Assignee: ASM Lithography B.V., Veldhoven, Netherlands

[21] Appl. No.: 09/103,734

[22] Filed: Jun. 24, 1998

[30] Foreign Application Priority Data

Dec. 29, 1997 [EP] European Pat. Off. ............. 97204133

[51] Int. Cl.[7] .......................... H02K 41/00; G05G 11/00; A47B 85/00
[52] U.S. Cl. ......................... 310/12; 310/13; 74/490.07; 108/20
[58] Field of Search ............................ 310/12, 13, 15, 310/22; 74/490.07; 108/20

[56] References Cited

U.S. PATENT DOCUMENTS

| | | | |
|---|---|---|---|
| 4,457,664 | 7/1984 | Judell et al. | 414/779 |
| 4,516,253 | 5/1985 | Novak | 378/34 |
| 5,204,712 | 4/1993 | Bouwer et al. | 355/53 |
| 5,260,580 | 11/1993 | Itoh et al. | 250/492.2 |
| 5,767,948 | 6/1998 | Loopstra et al. | 355/53 |

FOREIGN PATENT DOCUMENTS

| | | | |
|---|---|---|---|
| 0 421 527 | 4/1991 | European Pat. Off. | |
| 0421527A1 | 4/1991 | European Pat. Off. | B23Q 1/18 |
| WO9638766 | 12/1996 | WIPO | G03F 9/00 |

*Primary Examiner*—Thomas M. Dougherty
*Assistant Examiner*—Guillermo Perez
*Attorney, Agent, or Firm*—Pillsbury Madison & Sutro LLP

[57] ABSTRACT

A positioning device is disclosed. The positioning device has a first part and a second part, the second part further has an object table. The second part may be displaced relative to the first part parallel to the XY-plane and may be rotated about the Z-axis by means of three motors. The motors are Lorentz type motors having a permanent magnet system and an electrical coil system cooperating therewith. The electrical coil systems each have windings which are substantially directed parallel to a main axis of the electrical coil system and perpendicular to the Z-axis. According to the invention, the main axis of each of the three motors encloses an angle of substantially 120° with the main axis of each of the two other motors. In this manner, the points of application on the second part of the driving forces of the three motors are uniformly distributed relative to the second part, so that the driving forces can be uniformly transmitted to the object table by means of a relatively light and simple stiffening structure of the second part. In a particular embodiment of the positioning device, the main axes of the three motors are mutually arranged in a star-shaped configuration. In a second embodiment the main axes of the three motors are mutually arranged in a triangular configuration. The positioning device is used in a lithographic projection apparatus according to the invention for displacing a substrate table of the lithographic device relative to a focusing unit of the lithographic projection apparatus.

12 Claims, 4 Drawing Sheets

POSITIONING DEVICE HAVING THREE COIL SYSTEMS MUTUALLY ENCLOSING ANGLES OF 120° AND LITHOGRAPHIC DEVICE COMPRISING SUCH A POSITIONING DEVICE

The invention relates to a positioning device provided with a first part, a second part comprising an object holder for retaining a substantially disc-shaped object in a position parallel to an X-direction and parallel to a Y-direction which is perpendicular to the X-direction, and three motors by means of which the second part is displaceable with respect to the first part parallel to the X-direction and parallel to the Y-direction and is rotatable about an axis of rotation which is parallel to a Z direction which is perpendicular to the X-direction and perpendicular to the Y-direction, each of said motors being provided with a permanent magnet system and an electric coil system which is to cooperate with the magnet system, which electric coil system is provided with at least one electric coil with windings which extend substantially parallel to a main axis of the coil system which is perpendicular to the Z-direction.

The invention also relates to a lithographic device provided with a radiation source, a mask holder, a focusing unit with a central axis, and a positioning device with a substrate holder which is displaceable with respect to the focusing unit parallel to an X-direction which is perpendicular to the central axis and parallel to a Y-direction which is perpendicular to the X-direction and perpendicular to the central axis.

A positioning device of the kind mentioned in the opening paragraph is known from EP-A-0 421 527. The first part of the known positioning device comprises a carriage which is displaceable with a comparatively low accuracy parallel to the X-direction and parallel to the Y-direction by means of a spindle drive mechanism of the positioning device. The second part of the known positioning device comprises a substrate holder which extends parallel to the X-direction and parallel to the Y-direction, which rests on a static air bearing via a number of support elements, as seen parallel to the vertical Z-direction, and which is displaceably guided by means of the static air bearing over a guiding surface which extends also parallel to the X-direction and parallel to the Y-direction and which is provided on a base of the positioning device. The known positioning device comprises an X-motor by means of which the second part is displaceable with a comparatively high accuracy with respect to the first part parallel to the X-direction, and two Y-motors by means of which the second part is displaceable with a comparatively high accuracy with respect to the first part parallel to the Y-direction and is rotatable about the axis of rotation. The coil systems of the X-motor and the two Y-motors are fastened to the first part, while the magnet systems of the X-motor and the two Y-motors are fastened to the second part. The X-motor and the two Y-motors are arranged in line with one another, seen parallel to the X-direction, the X-motor being centrally placed between the two Y-motors. The main axis of the X-motor is directed parallel to the Y-direction, whereas the main axes of the two Y-motors are directed parallel to the X-direction.

The known positioning device is suitable for the positioning of substantially disc-shaped substrates with a comparatively high accuracy in the submicron range. If such a high accuracy is to be achieved, deformations of the substrate holder arising during operation under the influence of driving forces exerted by the three motors on the substrate holder must be limited as much as possible. To this end, said driving forces must be introduced as uniformly as possible into the substrate holder. A disadvantage of the known positioning device is that the positions in which the driving forces of the three motors arranged in line with one another apply themselves to the first part are concentrated adjacent a diagonal of the substrate holder which is directed parallel to the X-direction. As a result of this, the first part must be provided with a comparatively heavy and complicated stiffening construction for transmitting the driving forces to the substrate holder in a uniform manner. In addition, said mutual arrangement of the three motors leads to a constructively unfavorable positioning of the support elements via which the static air bearing of the first part supports the substrate holder, as seen parallel to the vertical Z direction. Said support elements are provided on either side of the three motors arranged in line with one another in the known positioning device, so that said stiffening construction must also comprise constructional parts for uniformly transmitting supporting forces exerted by the support elements to the substrate holder.

It is an object of the invention to provide a positioning device of the kind mentioned in the opening paragraph in which the driving forces exerted on the first part by the motors of the positioning device during operation can be transmitted to the object holder in a uniform manner by means of a comparatively light and simple stiffening construction of the first part.

The positioning device according to the invention is for this purpose characterized in that the main axis of the coil system of each of the three motors encloses an angle of substantially 120° with the main axis of the coil system of each of the two other motors. It is achieved thereby that the positions in which the driving forces of the three motors apply themselves to the first part form the corner points of an imaginary triangle. Said positions are thus not concentrated adjacent a diagonal of the object holder, but are distributed more uniformly over the object holder, as seen parallel to the X-direction and parallel to the Y-direction. This means that the driving forces exerted on the first part can be transmitted uniformly to the object holder by means of a comparatively light and simple stiffening construction of the first part.

A special embodiment of a positioning device according to the invention is characterized in that the main axes of the coil systems of the three motors are mutually arranged in a star-shaped configuration. In this special embodiment, three interspacings mutually arranged in a triangle are present between the respective coil systems of the three motors, which interspacings can be utilized for the placement of three support elements for supporting the object holder parallel to the Z-direction or of three actuators for displacing the object holder with respect to the first part parallel to the Z-direction and pivoting the object holder with respect to the first part about a first pivot axis directed parallel to the X-direction and a second pivot axis directed parallel to the Y-direction. The positions in which the driving forces of the three motors apply themselves to the object holder and the positions in which the supporting forces of said three support elements or said three actuators apply themselves to the object holder are thus uniformly distributed adjacent an imaginary circle, so that the driving forces exerted on the object holder and the supporting forces exerted on the object holder can be uniformly transmitted to the object holder by means of a common comparatively light and simple stiffening construction of the first part.

A further embodiment of a positioning device according to the invention is characterized in that the main axes of the coil systems of the three motors are mutually positioned in a triangular arrangement. This provides a particularly compact construction of the positioning device in which, moreover, three support elements for supporting the object holder parallel to the Z-direction or three actuators for displacing the object holder with respect to the first part parallel to the Z-direction and pivoting the object holder with respect to the first part about a first pivot axis directed parallel to the X-direction and a second pivot axis directed parallel to the Y-direction can be integrated in a constructively advantageous manner.

A yet further embodiment of a positioning device according to the invention is characterized in that the first part is displaceable parallel to the X-direction and parallel to the Y-direction with respect to a base of the positioning device by means of at least two further motors. In this yet further embodiment, the object holder is displaceable parallel to the X-direction and parallel to the Y-direction over comparatively large distances and with comparatively low accuracies by means of the two further motors, while the object holder is displaceable parallel to the X-direction and parallel to the Y-direction over comparatively small distances and with comparatively high accuracies and is rotatable about the axis of rotation directed parallel to the Z-direction with comparatively high accuracies by means of the three motors which are mutually arranged at angles of 120°.

A lithographic device of the kind mentioned in the second paragraph is known from WO-A-96/38766. The known lithographic device is used in the manufacture of integrated semiconductor circuits by means of an optical lithographic process. The radiation source in the known lithographic device is a light source, while the focusing unit is an optical lens system by means of which a sub-pattern of an integrated semiconductor circuit, which is present on a mask which is placeable on the mask holder, is imaged on a reduced scale on a semiconductor substrate which is placeable on the substrate holder. Such a semiconductor substrate comprises a large number of fields on which identical semiconductor circuits are provided. In this known lithographic device, an exposure method following the so-called "step and repeat" principle is used, whereby the individual fields are consecutively exposed through the mask, while a next field of the semiconductor substrate is brought into position with respect to the focusing unit by the positioning device each time between two consecutive exposure steps. This process is repeated a number of times, with a different mask having a different sub-pattern each time, so that integrated semiconductor circuits with comparatively complicated structures can be manufactured. Since such structures have detail dimensions which lie in the submicron range, the sub-patterns present on the consecutive masks must be imaged on the fields of the semiconductor substrate with an accuracy in the submicron range. The substrate holder, therefore, must be in an accurate position with respect to the focusing unit during operation.

The lithographic device according to the invention is characterized in that the positioning device used therein is a positioning device according to the invention. The favorable properties of the positioning device according to the invention become particularly apparent in the lithographic device according to the invention in that deformations of the substrate holder arising during operation as a result of the driving forces of the positioning device exerted on the substrate holder are limited as much as possible as a result of the uniform introduction of the driving forces into the substrate holder. This benefits the accuracy with which the substrate holder can be positioned with respect to the focusing unit.

The invention will be explained in more detail below with reference to the drawing, in which FIG. 1 diagrammatically shows a lithographic device according to the invention.

Figure 1:
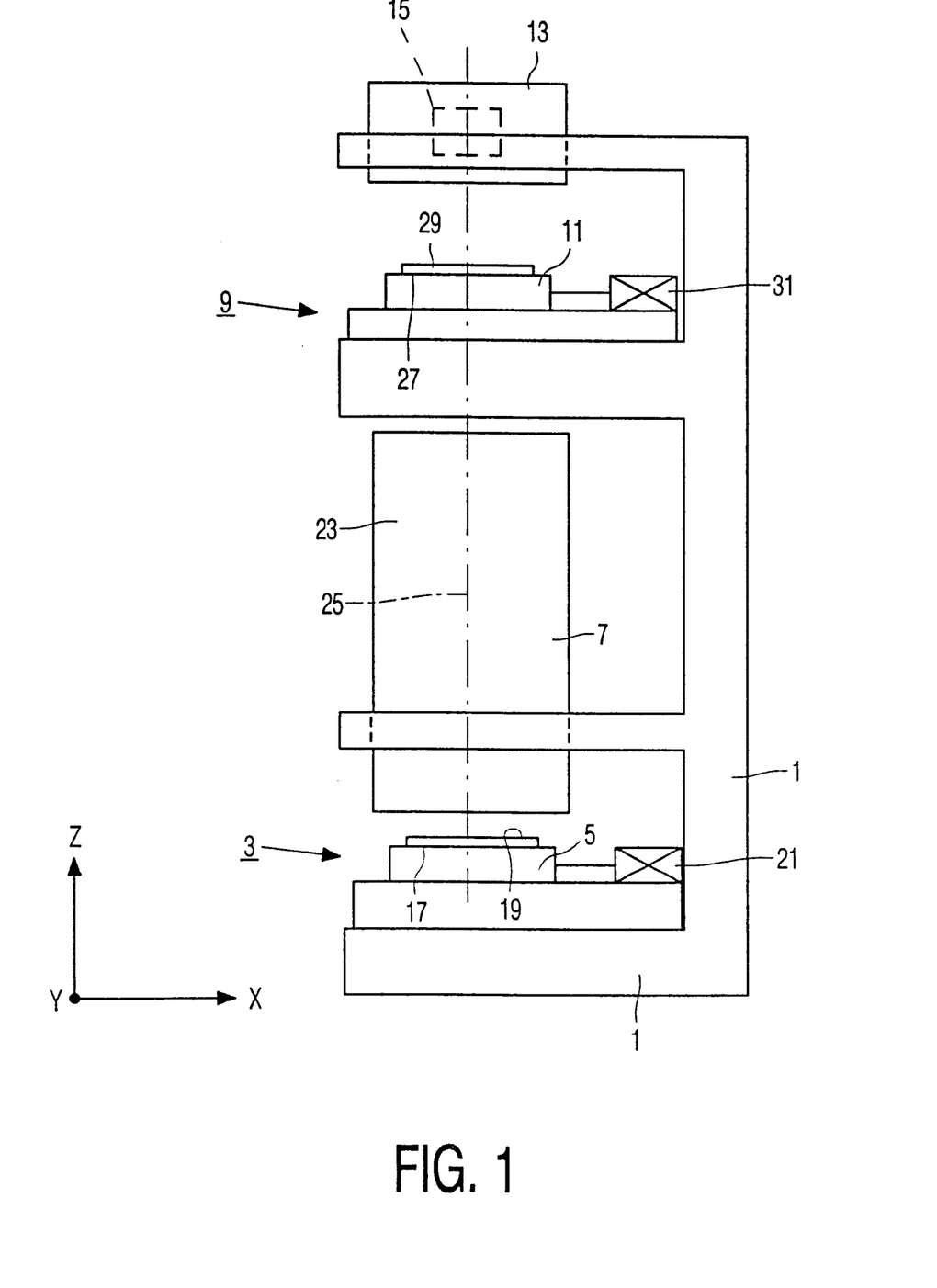

The lithographic device according to the invention shown diagrammatically in FIG. 1 is used in the manufacture of integrated semiconductor circuits by an optical lithographic process using an imaging method which follows the so-called "step and scan" principle. As FIG. 1 diagrammatically shows, the lithographic device is provided with a frame 1 which supports in that order, seen parallel to a vertical Z-direction, a positioning device 3 according to the invention with a substrate holder 5, a focusing unit 7, a further positioning device 9 with a mask holder 11, and a radiation source 13. The lithographic device shown in FIG. 1 is an optical lithographic device, the radiation source 13 comprising a light source 15. The substrate holder 5 comprises a support surface 17 which extends perpendicularly to the Z direction and on which a substantially disc-shaped semiconductor substrate 19 can be retained in a position perpendicular to the Z-direction during operation. The substrate holder 5 is displaceable parallel to an X-direction which is perpendicular to the Z-direction and parallel to a Y-direction which is perpendicular to the X-direction and perpendicular to the Z-direction with respect to the focusing unit 7 by means of a drive unit 21 of the positioning device 3 which is to be described in more detail below. The focusing unit 7 is an imaging or projection system and comprises an optical lens system 23 with an optical central axis 25 which is parallel to the Z direction and an optical reduction factor which is, for example, 4 or 5. The mask holder 11 comprises a support surface 27 which extends perpendicularly to the Z-direction and on which a mask 29 can be retained in a position perpendicular to the Z-direction during operation. The mask 29 comprises a pattern or a sub-pattern of an integrated semiconductor circuit. The mask holder 11 is displaceable parallel to the X-direction with respect to the focusing unit 7 by means of a drive unit 31, depicted diagrammatically only in FIG. 1, of the further positioning device 9. During operation, a light beam originating from the light source 15 is guided through the mask 29 and focused on the semiconductor substrate 19 by means of the lens system 23. The semiconductor substrate 19 comprises a large number of individual fields on which identical semiconductor circuits are provided. The fields of the semiconductor substrate 19 are consecutively exposed through the mask 29 for this purpose. During the exposure of an individual field of the semiconductor substrate 19, the substrate holder 5 with the semiconductor substrate 19 and the mask holder 11 with the mask 29 are synchronously displaced parallel to the X-direction with respect to the focusing unit 7 by means of the positioning device 3 and the further positioning device 9, respectively, so that the pattern or sub-pattern present on the mask 29 is scanned, seen parallel to the X-direction. After the exposure of an individual field of the semiconductor substrate 19, a next field of the semiconductor substrate 19 is brought into position with respect to the focusing unit 7 each time in that the substrate holder 5 with the semiconductor substrate 19 is displaced parallel to the X-direction and/or parallel to the Y-direction by means of the positioning device 3. This process is repeated a number of times, with a different mask each time, so that complicated integrated semiconductor circuits with a layered structure are obtained. The integrated semiconductor circuits to be manufactured by means of the lithographic device have structures with detail dimensions which lie in the submicron range. Since the semiconductor substrate 19 is exposed consecutively through a number of different masks, the patterns present on the masks are to be imaged in succession on the semiconductor substrate 19 with an accuracy which also lies in the submicron range, or even in the nanometer range. The substrate holder 5, therefore, must be positioned between two consecutive exposure steps with a similar accuracy with respect to the focusing unit 7, and the substrate holder 5 and the mask holder 11 must also be displaced synchronously with respect to the focusing unit 7 with a similar accuracy during an exposure step. Very high requirements are thus imposed on the positioning accuracies of the positioning device 3 and the further positioning device 9.

Figure 2:
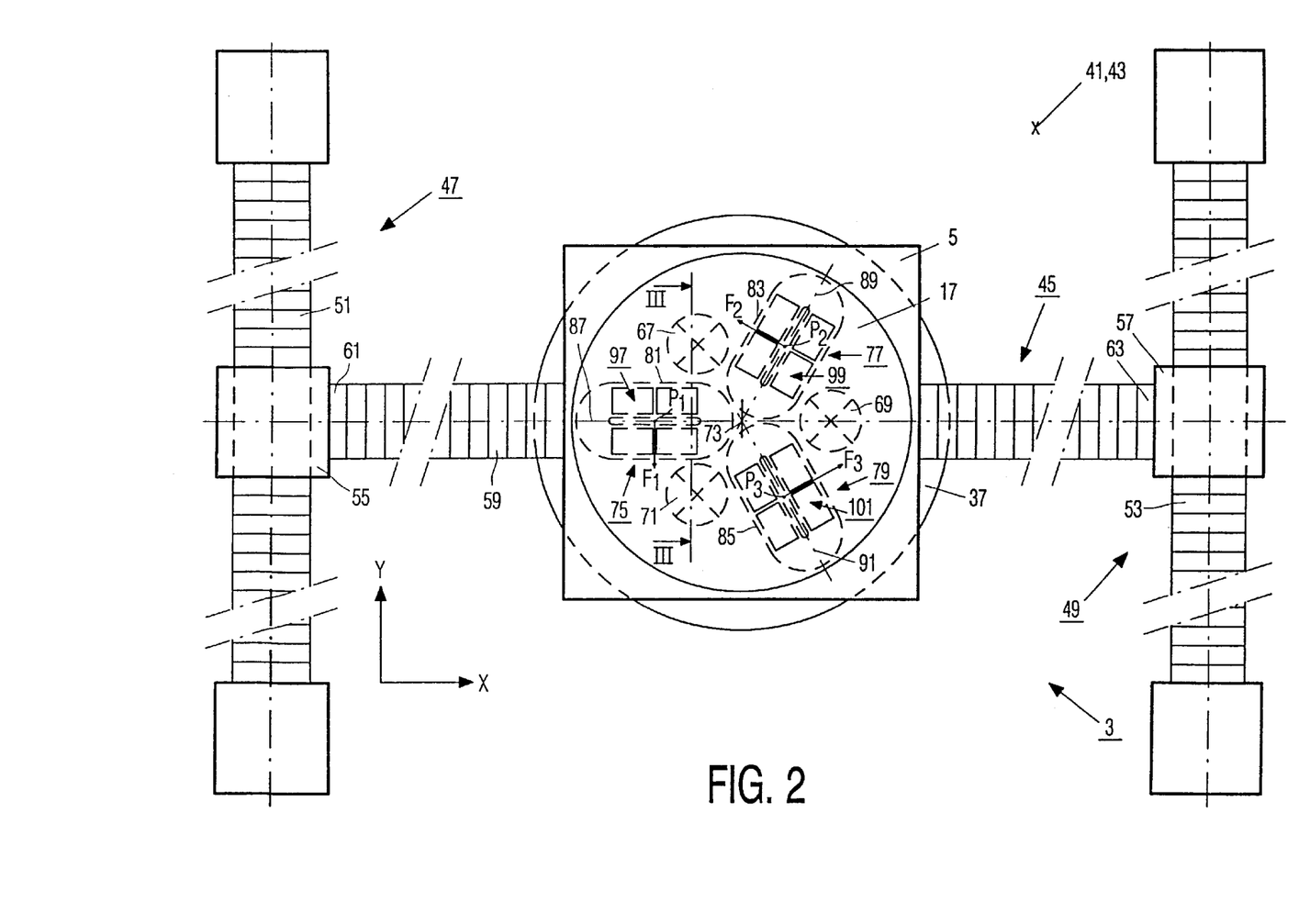
FIG. 2 is a diagrammatic plan view of a first embodiment of a positioning device used in the lithographic device of FIG. 1.
Figure 3:
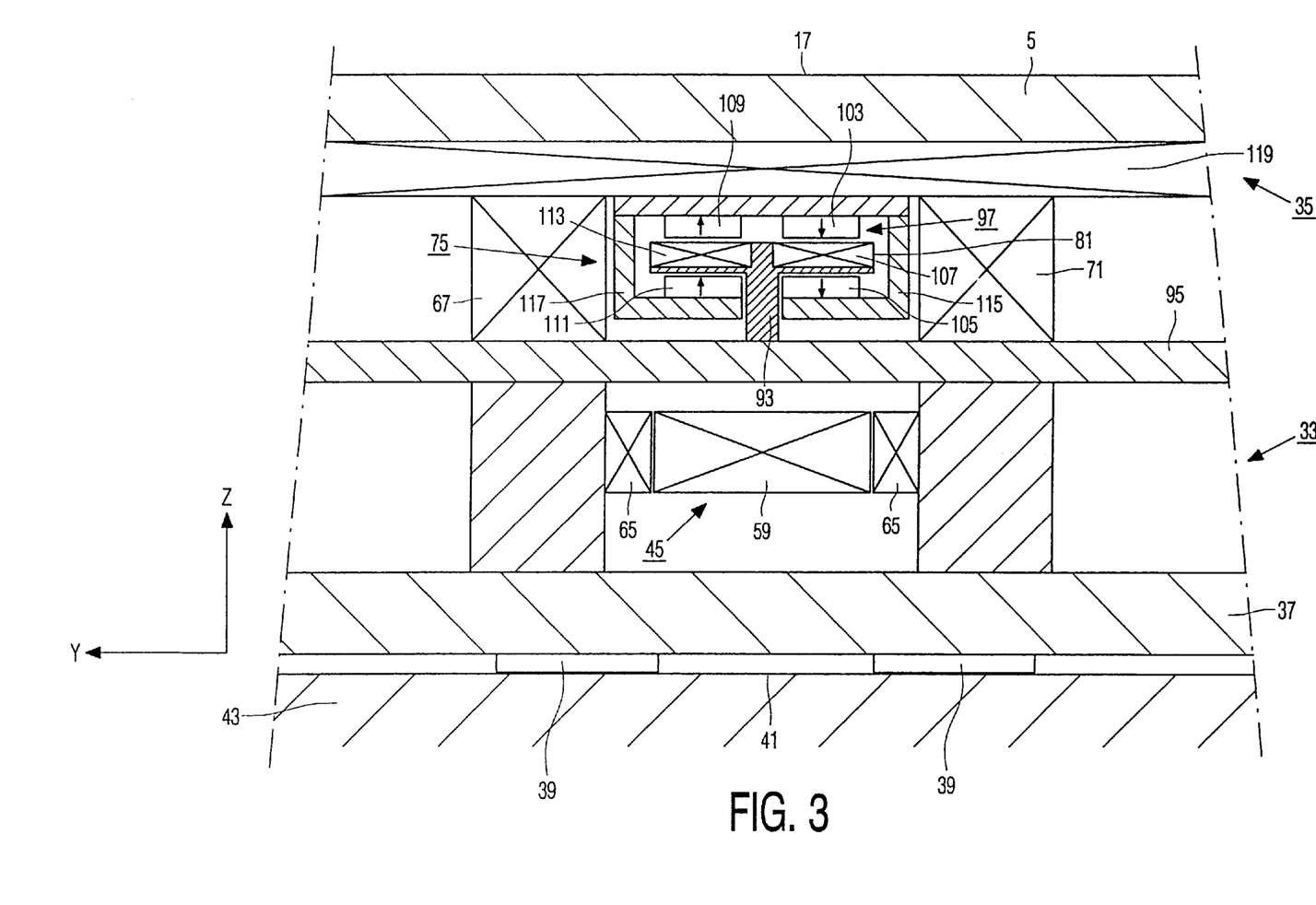
FIG. 3 is a diagrammatic cross-section taken on the line III—III in FIG. 2.

As FIGS. 2 and 3 diagrammatically show, the positioning device 3 comprises a first part 33 and a second part 35. The first part 33 comprises an aerostatically supported foot 37 in which a number of static air bearings 39 are provided by means of which the first part 33 rests on a guide surface 41, which surface extends parallel to the X-direction and parallel to the Y-direction and which surface is provided on a base 43 of the positioning device 3, viewed parallel to the vertical Z-direction. The first part 33 is also displaceably guided over the guide surface 41 parallel to the X-direction and parallel to the Y-direction by means of the static air bearings 39.

As FIG. 2 shows, the positioning device 3 comprises a linear electric X-motor 45 which is usual and known per se and by means of which the first part 33 is displaceable parallel to the X-direction over comparatively large distances with comparatively low accuracies, and two linear electric Y-motors 47 and 49 which are usual and known per se and by means of which the first part 33 is displaceable parallel to the Y-direction over comparatively large distances with comparatively low accuracies. The linear Y-motors 47 and 49 each comprise a stator 51, 53 which extends parallel to the Y-direction and which is fastened to the base 43, and a translator 55, 57 which is displaceably guided along the stator 51, 53. The linear X-motor 45 comprises a stator 59 which extends parallel to the X-direction and of which a first end 61 is fastened to the translator 55 of the linear Y-motor 47 and of which a second end 63 is fastened to the translator 57 of the linear Y-motor 49. As FIG. 3 shows, the linear X-motor 45 further comprises a translator 65 which is displaceably guided along the stator 59 and is fastened to the first part 33.

As FIGS. 2 and 3 show, the positioning device 3 further comprises three support elements 67, 69, 71 by means of which the second part 35 with the substrate holder 5 is supported parallel to the Z-direction with respect to the first part 33. The support elements 67, 69, 71, which are of a kind usual and known per se and which are not shown in any detail in FIGS. 2 and 3 for simplicity's sake, each exert a supporting force on the second part 35 in a direction parallel to the Z-direction, and allow displacements of the second part 35 with respect to the first part 33 which are directed parallel to the X-direction, displacements of the second part 35 with respect to the first part 33 which are directed parallel to the Y-direction, and rotations of the second part 35 with respect to the first part 33 about an axis of rotation 73 which is parallel to the Z-direction. Instead of the support elements 67, 69, 71, however, three Z-actuators may alternatively be used, which also allow of the displacements and rotations of the second part 35 with respect to the first part 33 mentioned above. Said three Z-actuators not only support the second part 35 parallel to the Z-direction with respect to the first part 33, but the second part 35 is also displaceable by means of said three Z-actuators with respect to the first part 33 parallel to the Z-direction and pivotable about a first pivot axis directed parallel to the X-direction and about a second pivot axis directed parallel to the Y-direction.

As FIGS. 2 and 3 further show, the positioning device 3 comprises three substantially identical Lorentz motors 75, 77, 79 which are usual and known per se and by means of which the second part 35 with the substrate holder 5 is displaceable parallel to the X-direction and parallel to the Y-direction with respect to the first part 33 over comparatively small distances with comparatively high accuracies and is rotatable about said axis of rotation 73 which is parallel to the Z-direction. The Lorentz motors 75, 77, 79 each comprise an electric coil 81, 83, 85 with windings which extend substantially parallel to a main axis 87, 89, 91 of the respective electric coil 81, 83, 85 which is perpendicular to the Z-direction. As FIG. 3 shows for the Lorentz motor 75, the electric coil 81, 83, 85 of each Lorentz motor 75, 77, 79 is fastened to a mounting plate 95 of the first part 33 via a connecting bridge 93, said mounting plate extending perpendicularly to the Z-direction. The Lorentz motors 75, 77, 79 each further comprise a permanent magnet system 97, 99, 101 for cooperation with the relevant electric coil 81, 83, 85. As FIG. 3 shows for the Lorentz motor 75, the magnet system 97, 99, 101 of each Lorentz motor 75, 77, 79 comprises a first pair of permanent magnets 103, 105 which are magnetized in the same direction parallel to the Z-direction and which are positioned on either side of a first half 107 of the relevant electric coil 81, 83, 85 so as to cooperate with this first half 107, and a second pair of permanent magnets 109, 111 which are magnetized in a direction opposed to that of the first pair of magnets 103, 105 and which are positioned on either side of a second half 113 of the relevant electric coil 81, 83, 85 so as to cooperate with this second half 113. The magnets 103 and 105 are fastened to a first magnetic flux conductor 115 of the relevant Lorentz motor 75, 77, 79, and the magnets 109 and 111 are fastened to a second magnetic flux conductor 117 of the relevant Lorentz motor 75, 77, 79, said magnetic flux conductors 115, 117 being fastened to a stiffening construction 119 of the second part 35 which is indicated diagrammatically only in FIG. 3 and on which the substrate holder 5 is fastened. As is shown in FIG. 2, the Lorentz motors 75, 77, 79 each exert a driving force $F_1$, $F_2$, $F_3$ on the stiffening construction 119 during operation, which force is directed substantially perpendicularly to the main axis 87, 89, 91 of the relevant electric coil 81, 83, 85 and substantially perpendicularly to the Z-direction, and which force applies itself to a point of application $P_1$, $P_2$, $P_3$ which is centrally positioned with respect to the relevant electric coil 81, 83, 85. The driving forces $F_1$, $F_2$, $F_3$ as well as the supporting forces exerted on the second part 35 by the support elements 67, 69, 71 are uniformly introduced into the substrate holder 5 by the stiffening construction 119, i.e. they are uniformly distributed over the entire construction of the substrate holder 5. Deformations of the substrate holder 5 arising under the influence of said driving forces and supporting forces are prevented as much as possible thereby, so that such deformations have as little adverse influence as possible on the accuracy with which the individual fields of the disc-shaped semiconductor substrate 19 placeable on the substrate holder 5 can be positioned with respect to the focusing unit 7 by means of the positioning device 3.

As is visible in FIG. 2, the main axes 87, 89, 91 of the three Lorentz motors 75, 77, 79 are mutually positioned in a star arrangement, the main axis 87, 89, 91 of each of the three Lorentz motors 75, 77, 79 enclosing an angle of substantially 120° with the main axis 87, 89, 91 of each of the respective two other Lorentz motors 75, 77, 79. Since the main axes 87, 89, 91 enclose angles of substantially 120° with one another, it is achieved that said points of application $P_1$, $P_2$, $P_3$, where the driving Lorentz forces $F_1$, $F_2$, $F_3$ of the Lorentz motors 7,5 77, 79 apply themselves to the stiffening construction 119 of the second part 35, form the corner points of an imaginary triangle and are accordingly uniformly distributed over the stiffening construction 119 as seen parallel to the X-direction and parallel to the Y-direction. The fact that said points of application are uniformly distributed over the stiffening construction 119 means that said driving forces can be uniformly distributed further over the entire construction of the substrate holder 5, and are accordingly uniformly introduced into the substrate holder 5, by means of a comparatively light and simple construction of the stiffening construction 119. The stiffening construction 119 is not shown in any detail in FIGS. 2 and 3. A possible stiffening construction is one, for example, which has an annular stiffening element which is positioned adjacent said points of application $P_1$, $P_2$, $P_3$, and a number of reinforcement ribs which extend in radial directions from the annular stiffening element. Since the main axes 87, 89, 91 are positioned in a star arrangement, three interspacings are present between the three Lorentz motors 75, 77, 79 arranged in a triangle, which interspacings are utilized for accommodating said three support elements 67, 69, 71. It is achieved thereby that the points of application $P_1$, $P_2$, $P_3$ of the driving forces $F_1$, $F_2$, $F_3$ and the positions in which the supporting forces of the three support elements 67, 69, 71 apply themselves to the stiffening construction 119 are uniformly distributed adjacent an imaginary circle, so that the stiffening construction 119 requires no major adaptations for transmitting to the substrate holder 5 and introducing into the substrate holder 5 not only said driving forces but also said supporting forces.

Figure 4:
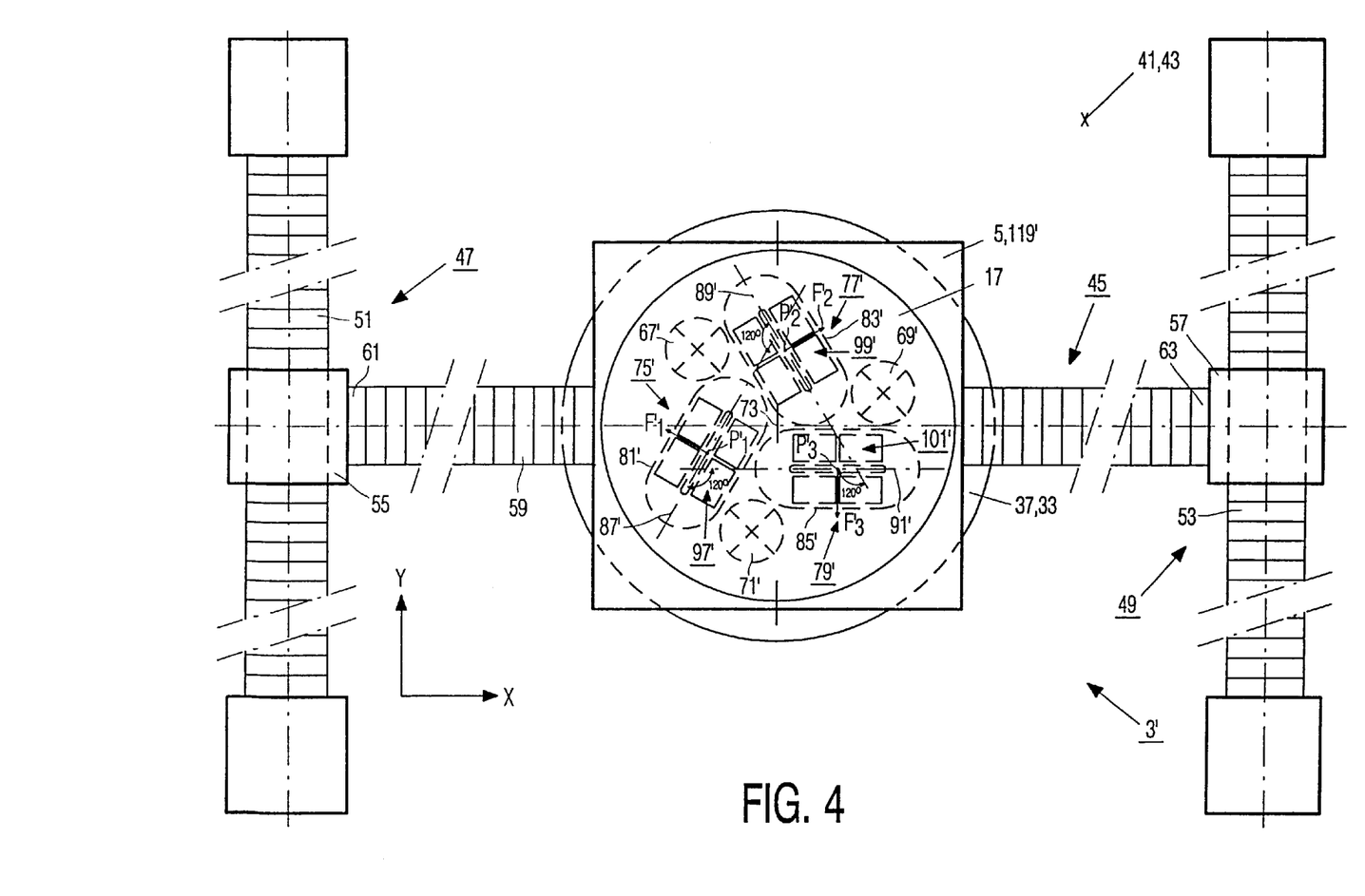
FIG. 4 is a diagrammatic plan view of a second embodiment of a positioning device used in the lithographic device of FIG. 1.

FIG. 4 shows a second embodiment of a positioning device 3' according to the invention which is suitable for use in the lithographic device according to the invention instead of the positioning device 3 described above. Components of the positioning device 3' corresponding to components of the positioning device 3 have been given corresponding reference numerals in FIG. 4. The ensuing description only deals with some differences between the positioning devices 3' and 3.

As FIG. 4 shows, the positioning device 3' again comprises three Lorentz motors 75', 77', 79' which basically correspond to the Lorentz motors 75, 77, 79 of the positioning device 3 discussed earlier. The main axis 87', 89', 91' of each of the three Lorentz motors 75', 77', 79' again encloses an angle of substantially 120° with the main axis 87', 89', 91' of each of the two other Lorentz motors 75', 77', 79', so that the points of application $P_1'$, $P_2'$, $P_3'$ at which the driving Lorentz forces $F_1'$, $F_2'$, $F_3'$ of the Lorentz motors 75', 77', 79' apply themselves to the stiffening construction 119' of the substrate holder 5 again form the corner points of an imaginary triangle and are uniformly distributed over the stiffening construction 119', seen parallel to the X-direction and parallel to the Y-direction. As a result, the driving forces of the Lorentz motors 75', 77', 79', can be uniformly distributed further over the entire construction of the substrate holder 5, and thus be uniformly introduced into the substrate holder 5, by means of a comparatively light and simple construction of the stiffening construction 119' also in the positioning device 3'.

The main axes 87', 89', 91' of the three Lorentz motors 75', 77', 79' in the positioning device 3' are mutually arranged in a triangle. This achieves that the three Lorentz motors 75', 77', 79' can be positioned at comparatively short distances from one another, so that a comparatively compact mutual arrangement of the three Lorentz motors 75', 77', 79' and a compact construction of the positioning device 3' are provided. As FIG. 4 shows, this mutual arrangement of the three Lorentz motors 75', 77', 79' means that the three support elements 67', 69', 71' of the positioning device 3' can also be placed at short distances from the three Lorentz motors 75', 77', 79', so that the compact construction of the positioning device 3' mentioned above is interfered with to a limited degree only by the presence of the three support elements 67', 69', 71'. It is noted that, as in the positioning device 3 discussed above, it is possible again to use three Z-actuators instead of the three support elements 67', 69', 71' of the positioning device 3', by means of which actuators the substrate holder 5 is not only supported parallel to the Z-direction with respect to the first part 33, but is also displaceable parallel to the Z-direction with respect to the first part 33 and is pivotable about a first pivot axis directed parallel to the X-direction and a second pivot axis directed parallel to the Y-direction.

In the positioning devices 3 and 3' according to the invention discussed above, the Lorentz motors 75, 77, 79, 75', 77', 79' used therein each comprise a single electric coil 81, 83, 85, 81', 83', 85'. It is noted that the invention also relates to positioning devices in which the motors used each have an electric coil system which is provided with two or more separate electric coils with windings which extend substantially parallel to a main axis of the coil system which is perpendicular to the Z-direction.

In the positioning devices 3 and 3' according to the invention discussed above, the second part 35 with the substrate holder 5 is supported parallel to the vertical Z-direction by the first part 33 with the aerostatically supported foot 37 via the three support elements or Z-actuators 67, 69, 71, 67', 69', 71'. It is noted that the invention also relates to positioning devices in which the second part with the object holder is supported parallel to the Z-direction not by the first part but is supported parallel to the Z-direction by a base of the positioning device, as is the case in the positioning device mentioned above and known from EP-A-0 421 527. The second part with the object holder in such a positioning device is coupled to the first part, as seen parallel to the X-direction and parallel to the Y-direction, exclusively by means of the driving forces of the three motors positioned at mutual angles of 120°.

In the lithographic device according to the invention described above, the positioning device 3 with the displaceable substrate holder 5 is a positioning device according to the invention, wherein the substrate holder 5 is displaceable parallel to the X-direction and parallel to the Y-direction over comparatively small distances with comparatively high accuracies and is rotatable about the axis of rotation 73 by means of three Lorentz motors 75, 77, 79 arranged at mutual angles of 120°. It is noted that the further positioning device 9 with the displaceable mask holder 11 used in the lithographic device described above may also be a positioning device according to the invention, such that the second part of the further positioning device is displaceable parallel to the X-direction and parallel to the Y-direction over comparatively small distances with a comparatively high accuracy with respect to the first part of the further positioning device and is rotatable about an axis of rotation directed parallel to the Z-direction, while the first part of the further positioning device is displaceable parallel to the X-direction over comparatively large distances with comparatively low accuracies by means of a further linear X-motor. Since the second part with the mask holder in such a lithographic device is not only displaceable parallel to the X-direction but is also displaceable parallel to the Y-direction and rotatable about said axis of rotation, the further positioning device need not have a straight guide directed parallel to the X-direction for the mask holder. The parallelity with respect to the X-direction of the displacements of the mask holder is thus not determined by the straightness of such a straight guide but by the accuracy with which the mask holder can be positioned parallel to the Y-direction and can be rotated about said axis of rotation by means of the further positioning device according to the invention.

An imaging method following the "step and scan" principle is used in the lithographic device according to the invention described above. It is noted that the invention also covers lithographic devices in which an imaging method following the so-called "step and repeat" principle is used, as is the case in the lithographic device known from the cited WO-A-96/38766, and in which the positioning device with the displaceable substrate holder is a positioning device according to the invention.

It is finally noted that a positioning device according to the invention can be used not only in a lithographic device but also in other devices in which a substantially disc-shaped object is to be retained by an object holder in an accurate position parallel to an X-direction and parallel to a Y-direction which is perpendicular to the X-direction and is to be accurately displaced and/or positioned parallel to the X-direction and/or parallel to the Y-direction. Examples of this are high-precision machine tools and analytical equipment.

What is claimed is:

1. A positioning device comprising:
   a first part;
   a second part comprising an object holder for retaining a substantially disc-shaped object in a position parallel to an X-direction and parallel to a Y-direction which is perpendicular to the X-direction; and
   three Lorentz motors constructed and arranged such that said second part is displaceable with respect to said first part parallel to said X-direction and parallel to said Y-direction and is rotatable about an axis of rotation which is parallel to a Z-direction which is perpendicular to said X-direction and perpendicular to said Y-direction,
   each of said motors being provided with a permanent magnet system connected with one of said first part and said second part and an electric coil system which cooperates with said magnet system and is connected with the other of said first part and said second part, said motors hence providing a Lorentz force coupling between said first part and said second part,
   said electric coil system of each of said motors being provided with at least one electric coil with windings which extend substantially parallel to a main axis of the coil system, said main axis of the coil system big perpendicular to said Z-direction,
   said main axis of said coil system of each of said three motors enclosing an angle of substantially 120° with said main axis of said coil system of each of the two other motors.

2. A positioning device as claimed in claim 1, characterized in that the main axes of the coil systems of the three motors are mutually arranged in a star-shaped configuration.

3. A positioning device as claimed in claim 1, characterized in that the main axes of the coil systems of the three motors are mutually positioned in a triangular arrangement.

4. A positioning device as claimed in claim 1, characterized in that the first part is displaceable parallel to the X-direction and parallel to the Y-direction with respect to a base of the positioning device by means of at least two further motors.

5. A positioning device according to claim 1, wherein said first part is connected with said electric coil system of each motor, and wherein said second part is connected with said permanent magnet system of each motor.

6. A positioning device according to claim 1,
   wherein said second part further comprises a stiffening member,
   wherein a force applied by said motors is coupled to said second part by said stiffening member.

7. A positioning device according to claim 6 wherein said stiffening member comprises:
   an annular stiffening element; and
   a plurality of reinforcement ribs extending in radial directions from said annular stiffening element.

8. A positioning device according to claim 1, wherein the coupling between said first part and said second part is devoid of structural contact.

9. A positioning device according to claim 8, wherein the coupling between said first part and said second part is exclusively said Lorentz force.

10. A positioning device according to claim 8, wherein the coupling includes said Lorentz force and an air bearing coupling.

11. A lithographic projection apparatus comprising:
    a radiation source;
    a mask holder;
    a focusing unit with a central axis; and
    a positioning device having a substrate holder,
    said positioning device comprising:
       a first part which is displaceable with respect to said focusing unit parallel to an X-direction which is perpendicular to said central axis and parallel to a Y-direction which is perpendicular to said X-direction and perpendicular to said central axis;
       a second part comprising said substrate holder for retaining a substantially disc-shaped substrate in a position parallel to the X-direction and parallel to the Y-direction; and
       three Lorentz motors constructed and arranged such that said second part is displaceable with respect to said first part parallel to said X-direction and parallel to said Y-direction and is rotatable about an axis of rotation which is parallel to a Z-direction which is perpendicular to said X-direction and perpendicular to said Y-direction, each of said motors being provided with a permanent magnet system connected with one of said first part and said second part and an electric coil system which cooperates with said magnet system and is connected with the other of said first part and said second part, said motors hence providing a Lorentz force coupling between said first part and said second part,
       said electric coil system of each of said motors being provided with at least one electric coil with windings which extend substantially parallel to a main axis of said coil system, said main axis of said coil system being perpendicular to said Z-direction, said main axis of the coil system of each of said three motors enclosing an angle of substantially 120° with said main axis of the coil system of each of the two other motors.

12. A step and scan lithographic projection apparatus comprising, a radiation source;

a mask holder;

a focusing unit with a central axis; and a positioning device having a substrate holder, said positioning device comprising:

a first part which is displaceable with respect to said focusing unit parallel to an X-direction which is perpendicular to said central axis and parallel to a Y-direction which is perpendicular to said X-direction and perpendicular to said central axis, a second part comprising said substrate holder for retaining a substantially disc-shaped substrate in a position parallel to said X-direction and parallel to said Y-direction; and three Lorentz motors constructed and arranged such that said second part is displaceable with respect to said first part, each of said motors being provided with a permanent magnet system and an electric coil system which cooperates with said magnet system, said electric coil system of each of said motors being provided with at least one electric coil with windings which extend substantially parallel to a main axis of said coil system, said main axis of said coil system being perpendicular to said Z-direction, wherein said main axis of the coil system of each of said three motors encloses an angle of substantially 120° with said main axis of the coil system of each of the two other motors, and wherein said motors provide a Lorentz force coupling between said first part and said second part.

* * * * *